United States Patent
Li

(10) Patent No.: US 7,125,746 B2
(45) Date of Patent: Oct. 24, 2006

(54) FLIP-CHIP SUB-ASSEMBLY, METHODS OF MAKING SAME AND DEVICE INCLUDING SAME

(75) Inventor: Kwei Chung Li, Hong Kong (CN)

(73) Assignee: MiniLogic Device Corporation Ltd., New Territories (CN)

( * ) Notice: Subject to any disclaimer, the term of this patent is extended or adjusted under 35 U.S.C. 154(b) by 95 days.

(21) Appl. No.: 10/981,477

(22) Filed: Nov. 5, 2004

(65) Prior Publication Data

US 2005/0093126 A1      May 5, 2005

Related U.S. Application Data

(62) Division of application No. 10/309,156, filed on Dec. 4, 2002, now Pat. No. 6,831,355.

(51) Int. Cl.
*H01L 21/48* (2006.01)

(52) U.S. Cl. ................ 438/108; 438/113; 438/E25.005

(58) Field of Classification Search ................ 438/460, 438/108, 113–119
See application file for complete search history.

(56) References Cited

U.S. PATENT DOCUMENTS

| | | | |
|---|---|---|---|
| 5,438,477 A | 8/1995 | Pasch | |
| 5,824,177 A * | 10/1998 | Yoshihara et al. | .......... 156/250 |
| 5,918,113 A | 6/1999 | Higashi et al. | |
| 6,077,382 A | 6/2000 | Watanabe | |
| 6,108,210 A | 8/2000 | Chung | |
| 6,241,145 B1 | 6/2001 | Maeda et al. | |
| 6,281,450 B1 | 8/2001 | Urasaki et al. | |
| 6,287,944 B1 | 9/2001 | Hara et al. | |
| 6,312,551 B1 | 11/2001 | Murayama et al. | |
| 6,429,528 B1 | 8/2002 | King et al. | |
| 2002/0185710 A1 * | 12/2002 | Zandman et al. | ........... 257/620 |
| 2003/0036249 A1 * | 2/2003 | Bauer et al. | ................. 438/460 |

* cited by examiner

*Primary Examiner*—Roy Potter
(74) *Attorney, Agent, or Firm*—Buchanan Ingersoll & Rooney PC

(57) ABSTRACT

An electronic device including a multi-chip die and a substrate member, said multi-chip die includes a plurality of integrated circuit chips which are integrally formed on the multi-chip die as a unitary member, each the integrated chip includes a plurality of electrodes for making external electrical contacts, the substrate member includes a circuit of a pre-determined pattern and a plurality of electric contacts disposed for making corresponding electrical connections with the electrodes of the integrated chips of the multi-chip die, the plurality of integrated circuit chips of the multi-chip die being connected as a unitary member to the substrate member.

6 Claims, 4 Drawing Sheets

— Die Saw

FLIP-CHIP SUB-ASSEMBLY, METHODS OF MAKING SAME AND DEVICE INCLUDING SAME

FIELD OF THE INVENTION

This invention relates to electronic modules, devices, sub-assemblies and methods for making same. More particularly, this invention relates to electronic modules, devices and sub-assemblies with an LCD display and methods for making same. More specifically, although of course not solely limiting thereto, this invention relates to electronic devices, modules and sub-assemblies containing an LCD display element with flip-chip bonded semiconductor integrated circuits.

BACKGROUND OF THE INVENTION

The use of semiconductor integrated circuits, especially in electronic devices, have greatly proliferated since their invention in early 1960's. Traditionally, semiconductor integrated circuits are provided and used in packaged forms with a semiconductor chip bonded to a lead-frame header or other package or substrate by find gold or aluminum wires that loop from contact pads disposed around the periphery of the circuitry surface of the semiconductor chips.

In order to alleviate the adverse parasitic effects as well as fulfilling the industry-wide demand for high lead counts and small foot prints, the "flip-chip" method or technology for bonding a semiconductor integrated circuit chip to a substrate was introduced. The flip-chip bonding technology has been described in many publications such as, for example, U.S. Pat. No. 3,429,040 issued to L. F. Miller in 1969 and many other subsequently published U.S. patent specifications. The conventional way to bond a semiconductor integrated circuit chip onto a substrate is by firstly flipping the semiconductor chip over so that the contact pads disposed on the top peripheral surface of the semiconductor chip is directly opposite the surface of a substrate member on which there are formed a corresponding set of contact pads for making interconnections between the semiconductor chip and the substrate member. The corresponding contact pads on the integrated circuit chip and the substrate member are then aligned and subsequently connected together to complete the electrical connection. Typically, the external electrodes or contact pads on an integrated circuit chip are provided with solder balls or bumps to ensure reliable connection and the components are connected by appropriate connection methods or means such as, for example, reflow soldering.

However, with the ever increasing demand for additional and improved performance from electric devices, more and more integrated circuits are required on an electronic device and the cost-effectiveness or benefits of the conventional flip-chip bonding technology begin to decline.

For example, in the early versions of mobile telephones or hand-held games, a single integrated circuit display driver chip may be sufficient to drive the entire display screen. However, to fulfill the ever increasing demand for additional features to be available for display and the ever increasing demand for higher resolution of such display features, a plurality of integrated circuit display drivers may be required for a single display means which is typically, but not limited to, an LCD display screen.

Likewise, with the ever increasing demand for further miniaturization of hand-held electronic devices such as, for example, mobile phones or hand-held computers, coupled with the ever increasing operating speed or frequencies of such devices, it is a clear trend that more and more integrated circuit chips connected by non-wire bonding means will be required by such electronic devices. On the other hand, it is noted that the yielding rate or productivity of electronic devices, modules or sub-assemblies declines significantly with the increasing number of "flip-chip" bonded integrated circuit chips. Hence, it will be highly desirable if there can be provided electronic devices, modules or sub-assemblies containing a plurality of integrated circuitry chips connected by the non-wire bonding means while alleviating the adverse consequences associated with the conventional flip-chip bonding technologies or methods. Similarly, it will be highly desirable if there can be made available electronic devices, modules including a plurality of integrated circuit chips connected by non-bonding wire means while alleviating the known adverse consequences of conventional flip-chip technology and method.

OBJECT OF THE INVENTION

Accordingly, it is an object of the present invention to provide electronic devices, modules and sub-assemblies including a plurality of semiconductor integrated circuit chips connected by non-bonding wire connection means. Likewise, it is also an object of the present invention to provide methods for assembling electronic sub-assemblies, modules and devices including a plurality of semiconductor integrated circuit chips connected by non-wire bonding connection means, thereby enjoying the characteristic benefits afforded by the flip-chip bonding method while alleviating the adverse consequences or shortcomings of conventional flip-chip technologies.

More specifically, although of course not solely limiting thereto, it is also an object of the present invention to provide LCD display modules, sub-assemblies or electronic devices incorporating same with a plurality of semiconductor integrated circuit chips connected by non-wire bonding means to fulfill the demand for ever increasing degree of complexity of the display features and/or higher resolution to be expected by the consumers or the general public. At a minimum, it is an object of the present invention to provide the public with a useful choice of electronic modules, sub-assemblies, electronic devices incorporating same and method for making same.

SUMMARY OF THE INVENTION

Accordingly, it is a first aspect of the present invention to provide an electronic device including a multi-chip die and a substrate member, said multi-chip die includes a plurality of integrated circuit chips which are integrally formed on said multi-chip die as a unitary member, each said integrated chip includes a plurality of electrodes for making external electrical contacts, said substrate member includes a circuit of a pre-determined pattern and a plurality of electric contacts disposed for making corresponding electrical connections with the electrodes of said integrated chips of said multi-chip die, said plurality of integrated circuit chips of said multi-chip die being connected as a unitary member to said substrate member.

According to a second aspect of the present invention, there is provided an electronic module or sub-assembly including a multi-chip die and a substrate member, said multi-chip die includes a plurality of integrated circuit chips which are integrally formed on said multi-chip die as a unitary member, each said integrated chip includes a plurality of electrodes for making external electrical contacts, said substrate member includes a circuit of a pre-determined pattern and a plurality of electric contacts disposed for making corresponding electrical connections with the electrodes of said integrated chips of said multi-chip die, said plurality of integrated circuit chips of said multi-chip die being connected as a unitary member to said substrate member.

According to a third aspect of the present invention, there is provided a method of connecting a plurality of integrated circuit chips to a substrate member, wherein said substrate member includes a pre-determined circuit pattern with a plurality of contact pads, said method includes:
- selecting a plurality of integrated circuit chips from a processed semi-conductor wafer,
- removing said plurality of integrated circuit chips from said wafer as an unitary member,
- aligning the electrodes on said plurality of integrated circuit chips corresponding with said plurality of contact pads on said substrate member,
- electrically connecting said electrodes with said contact pads.

Preferably, said plurality of integrated circuits on said multi-chip die being electrically isolated from each other before removal from the semiconductor wafer on which said integrated circuit chips are formed.

Preferably, said multi-chip die and said substrate member being connected by a flip-chip method.

Preferably, an anisotropic conductive film layer is disposed between said multi-chip die and said substrate member for making electrical connection between the electrodes on said multi-chip die and the contacts on said substrate.

Preferably, said substrate member being a glass substrate with at least a printed circuit.

Preferably, said electronic device includes a liquid crystal display (LCD) means.

Preferably, said liquid crystal display (LCD) being mounted on said substrate member.

Preferably, said substrate member includes a LCD glass substrate.

Preferably, said integrated chips include logic and memory elements.

Preferably, said pattern includes Indium Tin Oxide (ITO) wire connection.

Preferably, an anisotropic conductive film layer is disposed between said multi-chip die and said substrate member for making electrical connection between the electrodes on said multi-chip die and the contacts on said substrate, said electronic device includes a liquid crystal display means.

BRIEF DESCRIPTION OF THE DRAWINGS

Preferred embodiments of the present invention will be explained in further detail below by way of examples and with reference to the accompanying drawings, in which.

DETAILED DESCRIPTION OF THE PREFERRED EMBODIMENTS

Figure 1:
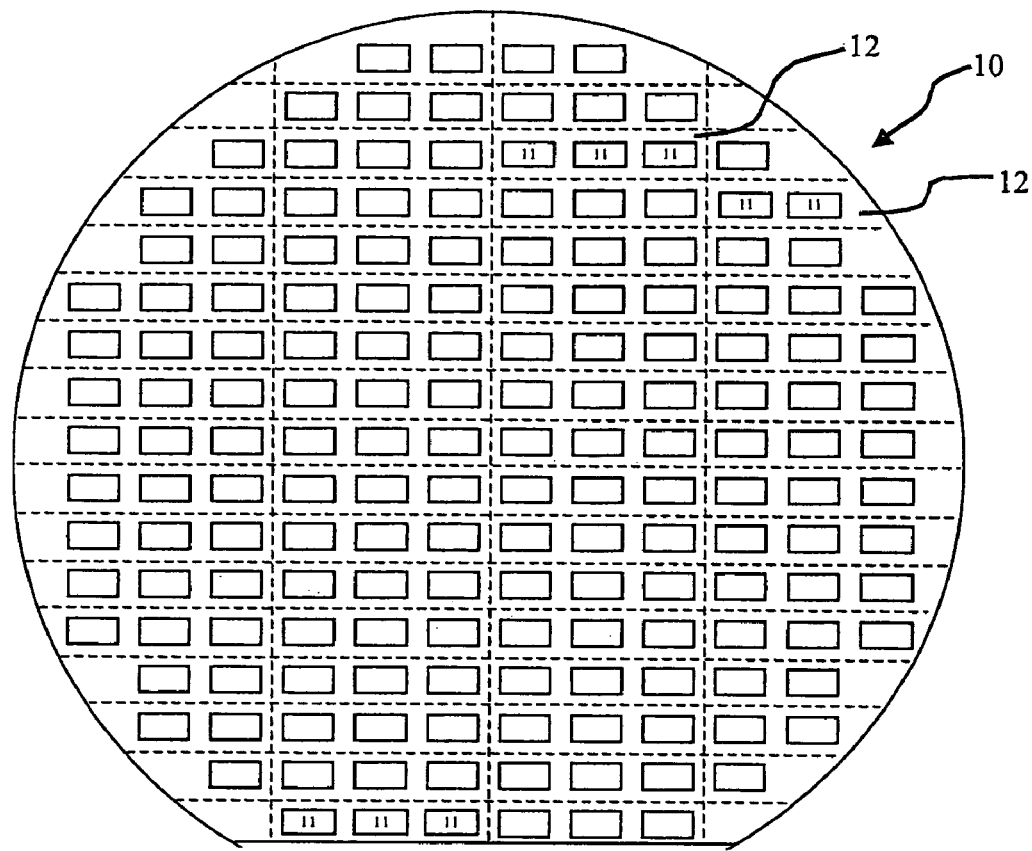
FIG. 1 shows schematically a processed semiconductor wafer including an array of electrically isolated integrated circuit chips.

Referring firstly to FIG. 1, there is shown a processed semiconductor wafer 10 containing a plurality of integrated chip 11. Typically, the integrated circuit chips 11 are integrally formed on the same wafer and are normally isolated or not interconnected electrically while still on the wafer. Usually, the integrated circuit chips are arranged in orderly array with constant separation distances between adjacent integrated circuit (IC) chips. Furthermore, while a single type of IC is usually found on a single processed wafer, it is not unusual that different types of isolated ICs are formed on the same wafer. In the present example, although each of the integrated circuit chip is designated with the numeral 11 for convenience, the ICs may be different or identical without loss of generality since the reference to individual ICs is primarily for illustrating the electrical connection between the ICs 11 and the corresponding substrate member 22. Of course, each of the ICs is formed with contact pads or electrodes for making electrical connections with external circuitry or other components of the same module or device. Of course, the integrated circuits may contain active as well as passive elements according largely to the purposes of application.

To prepare for the present invention, the IC chips 11 on the processed wafer are divided into groups each of which generally include a plurality of ICs. For example, the processed wafer 10 may be divided into groups comprising two, three, four or more ICs. Of course, there may be portions of the wafer which is not formed with an IC or a group may only comprise a single IC, depending on the wafer.

Figure 2:
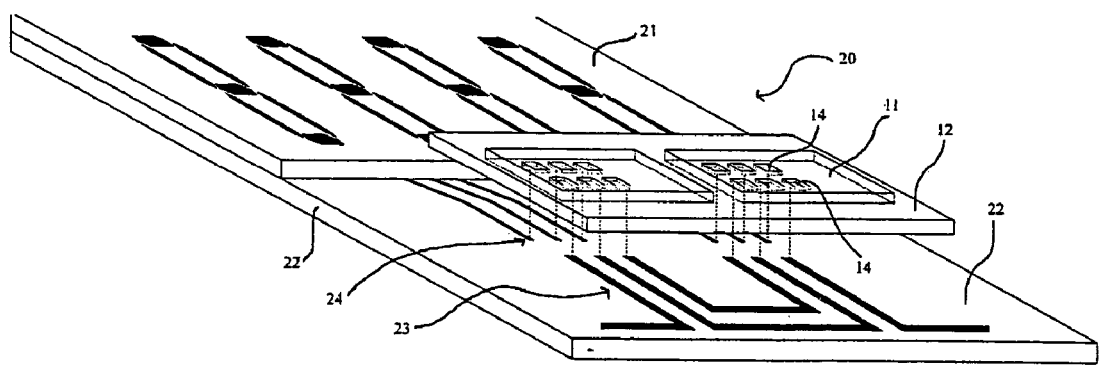
FIG. 2 illustrates an LCD display module or sub-assembly indicating the correlation between the electrodes on a plurality of integrated circuit chips on a multi-chip die and the corresponding contact pads disposed on a substrate member.

Turning now to FIG. 2, there is shown a semi-finished liquid crystal display (LCD) display module 20 with an LCD display means 21 already mounted an electrically connected to a substrate member 22 with a circuit of a pre-determined conductive pattern 23. For an LCD display module, an LCD glass substrate is commonly used, although other types of substrates can of course be used. The conductive pattern or circuits are usually printed made or developed on the top surface of the substrate member 22, although other appropriate methods for forming definitive conductive patterns, tracks or circuits can equally be applied.

In order to alleviate the shortcomings associated with the conventional "flip-chip" bonding technology, a multi-chip die containing a plurality of ICs integrally formed on the same multi-chip die are bonded as a unitary member, i.e. as a single piece containing two individual ICs, to the substrate member. The individual ICs are usually not interconnected while on the multi-chip die, although it should be understood that certain interconnections, for example, input/output connection, supply rails, etc. may be pre-formed between the individual ICs for further benefits. In order to form electrical connections between the ICs on the multi-chip die 12 and the conductive pattern or circuit 23 on the substrate, a plurality of conductive pads 24 are formed on the conductive pattern or circuit spatially corresponding to the counterpart electrodes on the ICs 11 of the multi-chip die 12. In general, the conductive pads 24 formed on the substrate 22 are generally disposed with relative spacing and distance similar to that between the electrodes of the ICs 11 on the multi-chip die 12.

For the sake of completeness, it will be noted that the electrodes 14 of the ICs 11 are disposed on the side of the multi-chip die 12 directly opposite the top surface of the conductive pattern bearing top surface of the substrate member 22.

Figure 3:
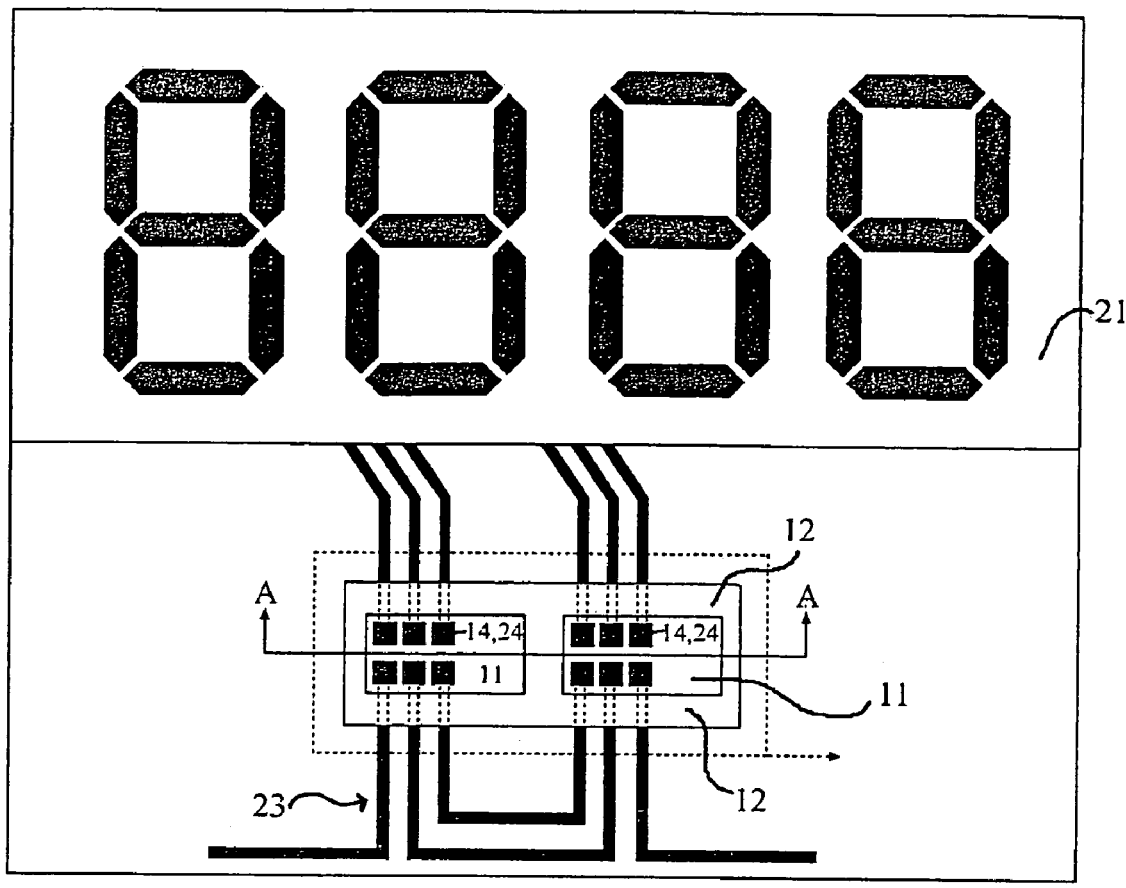
FIG. 3 illustrates schematically the module or sub-assembly of FIG. 2 when the multi-chip die has been duly aligned with the contact pads on the substrate member and connected.
Figure 5:
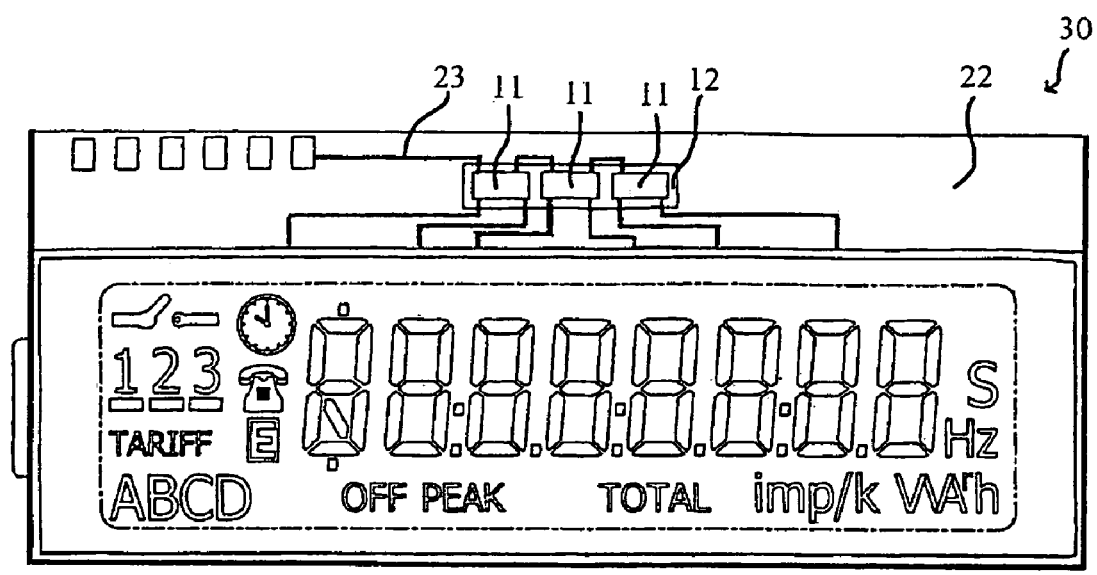
FIG. 5 illustrates a display module or sub-assembly including a multi-chip die integrally formed with three integrated circuit chips mounted on the module according to the methods of the present invention.
Figure 6:
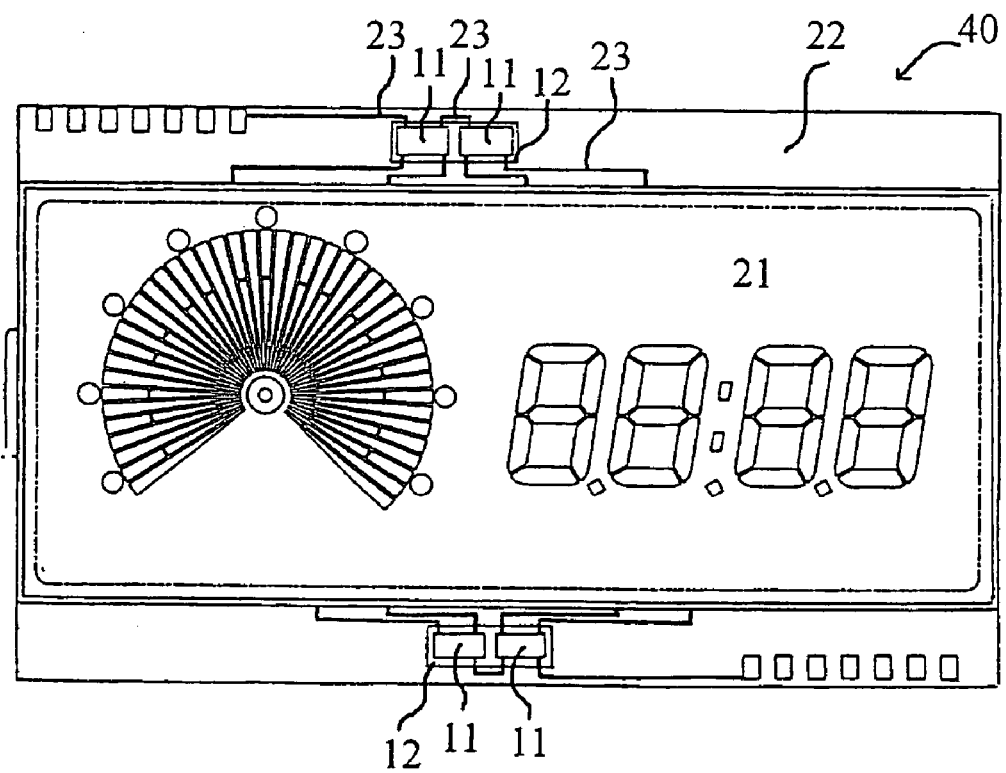
FIG. 6 illustrates a display means, module or sub-assembly including two multi-chip dies with two integrated circuit chips on each die and connected to the electronic means, module or sub-assembly according to the methods of the present invention.

It would be observed from FIG. 3, in which a complete module including the LCD display member 21 and the multi-chip die have been duly connected, that the electrodes on the ICs 11 of the multi-chip 12 generally overlap or overlay the corresponding conductive pads 24 on the substrate member 22. A variation of an LCD display module or sub-assembly constructed according to the present invention is shown in FIG. 5 in which a multi-chip die 12 comprising three integrated circuit chips 11 are mounted or bonded to the substrate member 22 as a unitary member and according to the methods of the present invention. A different display pattern is shown here to illustrate the increased complexity of the features to be displayed. Similarly, an LCD display constructed according to the methods of the present invention with two multi-chip dies each containing two ICs on the same die and individually mounted onto the substrate member 22 of the module are shown to illustrate the flexibility and sophistication of the assembling method of the present invention and the resulting modules or devices.

In the present specification, it will be understood same numerals will be used to designate parts of the same general characteristics for the sake of brevity unless the context otherwise requires.

Turning now to the making or assembly of the module, sub-assembly or device containing the present invention, a multi-chip die comprising a plurality of IC chips, for example, two, three, four or more are removed, for example, by die sawing from the processed wafer 10 to obtain the desirable multi-chip die 12. Thus, a plurality of ICs which are physically attached and preferably electrically isolated are obtained after die sawing. To provide easy electrical connection to the IC chip, conductive bumps or balls are applied to the electrodes or contact pads on the ICs 11. The contact pads or electrodes 14 on the IC are generally exposed for electrical connection and are generally disposed around the top peripheral surface of an IC chip. The conductive bumps on the IC may contain, for example, gold, indium, copper, such as copper UBM, copper post, lead/tin solder, Nickel, lead-free pure-tin, lead-free-tin bismuth, lead-free tin-silver or other appropriate bumping materials. The multi-chip die is then flipped over so that the surface of the multi-chip die, i.e. the surface of the wafer with the contact electrodes 14 exposed, is opposite to the top surface of the substrate member 22 on which a pattern of conductive pads have already been formed.

In particular, the pattern of conductive pads or preferably printed circuits are also provided with conductive pads arranged in spatial correlation to the electrodes 14 on the ICs so that the contact electrodes or pads of the ICs on the flipped multi-chip die will overlap or overlay the conductive pads 24 already formed or printed on the top surface of the substrate member 22 when the multi-chip die are properly aligned with the conductive pattern on the substrate member 22. After the multi-chip die and the substrate member have been duly aligned, a more permanent electrical connection process will then take place.

As a general note, materials suitable for use as the substrate member 22 may include Liquid Crystal Display (LCD) glass, Printed wiring board (PWB), Tape Carrier package (TCP), Ball Grid Array (BGA), semiconductor chip, plastic, ceramic, flexible film, etc.

Examples illustrating the electrical connection between the multi-chip die 12 and the substrate member 22 will be illustrated in more detail below.

EXAMPLE 1

Connection with an Anisotropic Conductive Film "ACF"

Figure 4:
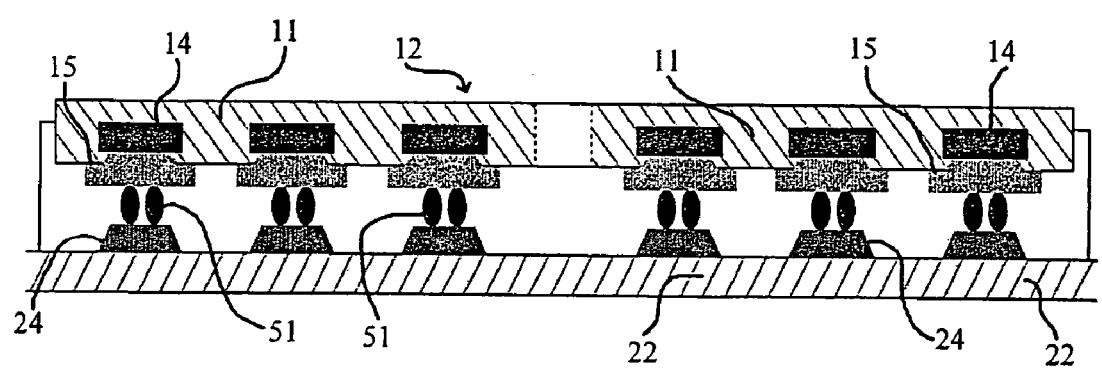
FIG. 4 is a cross-sectional elevated view showing electrical connection between the multi-chip die and the substrate made according to a first preferred method of the present invention.

Referring to FIG. 4, there is shown in elevation generally along the line A—A of FIG. 3 in more detail the electrical connection between the ICs 11 on the multi-chip die 12 with the substrate member 22. In this present mode of connection, an ACF film is placed between the flipped top surface of the multi-chip 12 and the conductive pads 24 carrying surface of the substrate before the multi-chip die 12 is placed with proper spatial alignment with the conductive pads 24 on the substrate member. The ACF is interposed in the space separating the ICs 11 and the substrate member 22 as an underfill.

In general, ACF is made of thermosetting resin, such as epoxy resin, or of thermoplastic resin, such as polyethylene, with electrode conductive particles dispersed in the resin. When the ACF is interposed between the conductive bumps 15 of the ICs and the conductive pads 24 of the substrate member 22, electrical connection is obtained between the conductive bumps 15 of the IC chips 11 and the conductive pads 24 of the substrate member 22. The IC chips 11 will be held in position by the resin of the ACF and will be more permanently fixed after curing because of the nature of the thermosetting or thermoplastic materials. Thus, the ICs may be reliably mounted and connected to perform the necessary functions.

Examples of known ACF which may be used in the present application are as follows:
(1) FC 262 B produced by Hitachi Chemical Co., Ltd. (epoxy type resin containing Ni particles)
(2) MJ 932 and MJ 353 produced by Sony Chemicals Corporation (epoxy type resin containing acrylic resin particles plated with Ni or Au).

EXAMPLE 2

Connection by Reflow Soldering Process

Figure 7:
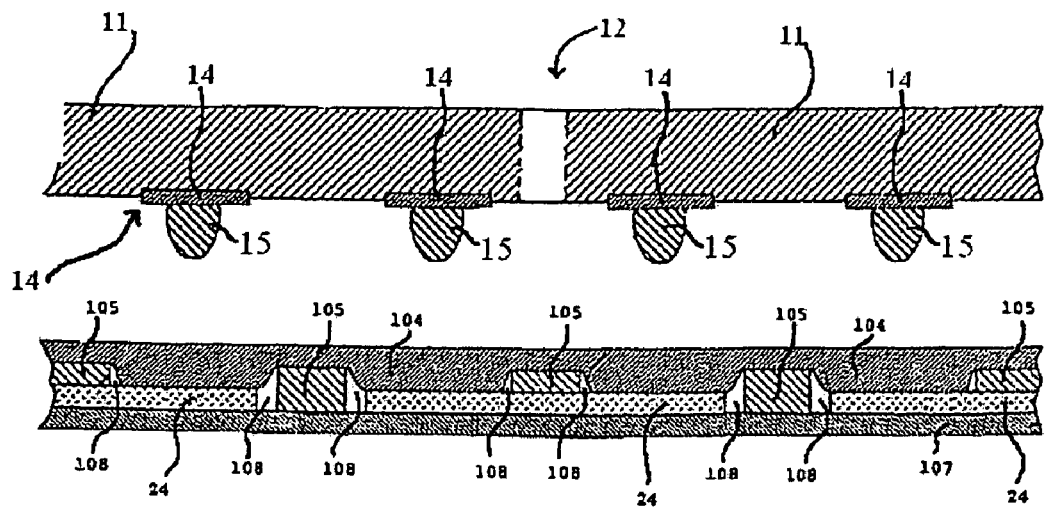
FIG. 7 illustrates a second embodiment of the methods for fulfilling the present invention and showing a multi-chip die in a substrate member before connection.
Figure 8:
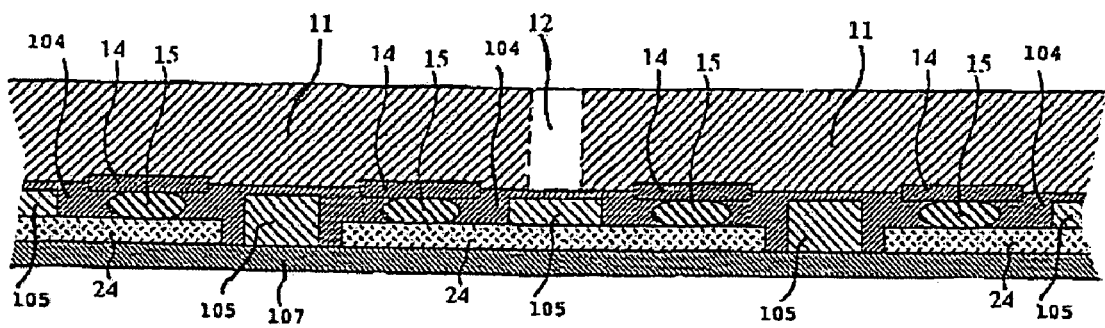
FIG. 8 illustrates a second embodiment of the methods for fulfilling the present invention and showing the multi-chip die in a substrate member after electrical connection.

Referring to FIGS. 7 and 8, a second mode of connection between the ICs 11 on the multi-chip die 12 will be explained in more detail.

Similar to the example above, the electrodes or conductive pads 14 on the ICs 11 of the multi-chip die are provided with conductive bumps 15 to ensure proper and reliable electrical connections. Similar to the process above, an underfill layer 104 is provided on the top surface of the substrate member. Masking 105 is provided at appropriate locations to prevent interferences or short circuits due to overflow of the bumping when melted. The appropriate underfill for the present process includes, for example, no-flow or compressive underfill such as epoxy based liquid. After the ICs 11 on the multi-chip die 12 have been properly aligned and mounted on the substrate member, the semi-assembled module is then subject to reflow soldering to impart more permanent electrical connections between the two components.

Thus, by way of the present invention, a plurality of integrated chips can be mounted on a substrate member utilizing a process which is akin to the one-chip flip-chip mounting technology while alleviating the major shortcomings of conventional flip-chip technologies. In this present methods and invention, the need to sequentially mount and align a plurality of ICs with many different steps, thereby jeopardizing the productivity or cost benefits of flip-chip technologies, is alleviated. In this regard, it will be noted that by employing a plurality or a multiplicity of identical or non-identical ICs on the same multi-chip die, the complexity of the features that can be produced on an LCD display module illustrated in the present invention can be expanded without undue introducing complexity in the assembling process.

While the present invention has been explained by reference to the preferred embodiments described above, it will be appreciated that the embodiments are only examples provided to illustrate the present invention and are not meant to be restrictive on the scope of the present invention. This invention should be determined from the general principles and spirit of the invention as described above. In particular, variations or modifications which are obvious or trivial to persons skilled in the art, as well as improvements made on the basis of the present invention, should be considered as falling within the scope and boundary of the present invention. Furthermore, while the present invention has been explained by reference to a module with an LCD display means, it should be appreciated that the invention can apply, whether with or without modification, to other electronic devices, sub-assemblies device and apparatus without loss of generality.

The invention claimed is:

1. A method of connecting a plurality of integrated circuit chips to a substrate member, wherein said substrate member includes a pre-determined circuit pattern with a plurality of contact pads, said method includes:

selecting a plurality of integrated circuit chips from a processed semi-conductor wafer, removing said plurality of integrated circuit chips from said wafer as an unitary member, aligning the electrodes on said plurality of integrated circuit chips corresponding with said plurality of contact pads on said substrate member, electrically connecting said electrodes with said contact pads.

2. An electronic device including a plurality of semiconductor integrated circuits connected according to the method of claim 1, characterised in that said plurality of integrated circuits are integrally formed on the same semiconductor wafer.

3. An electronic device according to claim 2, characterized in that said plurality of integrated circuits on the same semiconductor wafer are not interconnected by means on said semiconductor wafer.

4. An electronic device according to claim 2, characterized in that said multi-chip die and said substrate member being connected by a flip-chip method.

5. An electronic device according to claim 2, characterized in that an anisotropic conductive film layer is disposed between said multi-chip die and said substrate member for making electrical connection between the electrodes on said multi-chip die and the contacts on said substrate.

6. An electronic device according to claim 2, characterized in that an anisotropic conductive film layer is disposed between said multi-chip die and said substrate member for making electrical connection between the electrodes on said multi-chip die and the contacts on said substrate, said electronic device includes a liquid crystal display means.

* * * * *